United States Patent [19]

Barker et al.

[11] 4,410,813
[45] Oct. 18, 1983

[54] HIGH SPEED CMOS COMPARATOR CIRCUIT

[75] Inventors: Charles E. Barker, Round Rock; Michael D. Smith, Austin, both of Tex.

[73] Assignee: Motorola, Inc., Schaumburg, Ill.

[21] Appl. No.: 292,772

[22] Filed: Aug. 14, 1981

[51] Int. Cl.³ ............................................ H03K 5/153
[52] U.S. Cl. ...................................... 307/362; 307/297
[58] Field of Search .............. 307/448, 451, 469, 350, 307/362, 296 R, 297

[56] References Cited

U.S. PATENT DOCUMENTS 3,970,875  7/1976  Leehan ................................ 307/448
4,340,867  7/1982  Sand .................................... 307/448

*Primary Examiner*—John Zazworsky

*Attorney, Agent, or Firm*—Anthony J. Sarli, Jr.; Jeffrey Van Myers; Robert L. King

[57] ABSTRACT

A high speed comparator comprising an operational amplifier and two inverter portions is provided. The output voltage of the operational amplifier biases a control transistor coupled to the first inverter portion which is coupled to the operational amplifier in a closed loop. A stable reference voltage is coupled to an input of the operational amplifier and forces the switch point of the first inverter to be at the reference voltage. If the second inverter portion comprises transistors having the gate dimensions thereof sized the same as the transistors of the first inverter portion, the switch point of the second inverter is also at the reference voltage. The switch point of the fast comparator has thereby been isolated from process and temperature variations.

7 Claims, 2 Drawing Figures

HIGH SPEED CMOS COMPARATOR CIRCUIT

BACKGROUND OF THE INVENTION

1. Field of the Invention

This invention relates generally to comparators and more particularly to CMOS comparators having a fast response and a stable switch point.

2. Description of the Prior Art

Comparators are typically limited in many applications by having a slow output slew rate in response to an input voltage. In other words, the rise time of most comparators is often too slow. Many circuit applications require a comparator whose response is in the nanosecond range and cannot tolerate a rise time which is in the microsecond range.

Commonly, comparators which have attempted to improve the response time and speed have had various disadvantages. Because of variations in silicon content and other practical manufacturing problems, no two semiconductors are exactly identical. As a result, supposedly identical transistors will have varying parameters commonly called process variations. One disadvantage of previous fast comparators is the sensitivity of the output signal and rise time to variations in both processing and operating temperature. Process variations are particularly troublesome for one-shot circuits. One-shot circuits only produce a single output pulse in response to an input signal exceeding a reference voltage level. An example of a one-shot circuit is a circuit having two comparators with different switch points where a switch point is defined as the value of the input voltage which causes the level of the output voltage to change. Such one-shot circuits derive the output pulse width from the difference between the two switch points. The problem with fast one-shot circuits which utilize different switch points of two fast comparators is that the switch points tend to move in opposite directions over temperature changes and processing variation thereby causing a large variation in the output pulse width. Another disadvantage with some previous comparators used in one-shot circuits is the dependence of the output pulse width on the width of a trigger pulse used to produce the output pulse. A further disadvantage with some previous fast comparator circuits is that the input comparison voltage is coupled to a current electrode of a transistor. Comparators having this structural configuration draw large amounts of current from the input voltage circuit and may create an excessive load on the input circuit. Yet a further disadvantage with some previous fast comparator circuits is that the range of the reference voltage is limited and cannot be any closer to the supply voltage than the sum of the threshold voltages of transistors used in an inverter portion of the circuits.

SUMMARY OF THE INVENTION

Accordingly, an object of the present invention is to provide an improved CMOS comparator which has a fast response time and a stable switch point.

Another object of this invention is to provide an improved comparator which does not sink current from an input circuit and thereby load down the input circuit.

Yet another object of the invention is to provide an improved comparator which may be utilized in a one-shot circuit to provide an output pulse of constant width and which has a fast rise time.

It is also an object of the invention to provide an improved comparator which has a wider reference voltage range than comparator circuits of the prior art.

In carrying out the above and other objects and advantages of the present invention, there is provided, in one form, a fast CMOS comparator circuit having a predetermined reference voltage coupled to a first input of an operational amplifier. A first and a second transistor of opposite conductivity types are coupled in series between two supply voltages to form a first inverter. A current electrode and a control electrode of each of the first and second transistors are connected together at a second node which is coupled to a first input of the operational amplifier. Coupled either in parallel or series with the second transistor is a control transistor having a control electrode coupled to the output of the operational amplifier. The voltage at the first node is the switch point voltage of the comparator. The switch point is forced to equal the reference voltage due to the closed loop configuration of the operational amplifier although the output voltage of the operational amplifier will vary with processing and temperature changes. In other words, the voltage at the output of the operational amplifier is the voltage necessary to bias the control transistor so that the switch point of the inverter remains at the reference voltage throughout processing and temperature variation.

A second inverter and a second control transistor are coupled to an input signal for comparison with the reference voltage. The input signal is connected to control electrodes or gates of two transistors which comprise the second inverter, and the bias voltage at the operational amplifier's output is coupled to a control electrode or gate of the second control transistor. By sizing the gate dimensions of the transistors in the second inverter and the second control transistor to be the same ratio as the corresponding transistors of the first inverter and control transistor, the switch point of the second inverter is also at the reference voltage. Thus a comparator which has a fast rise time and a stable switch point has been provided. The above and other objects, features and advantages of the present invention will be more clearly understood from the following detailed description taken in conjunction with the accompanying drawings.

DESCRIPTION OF THE PREFERRED EMBODIMENT

Figure 1:
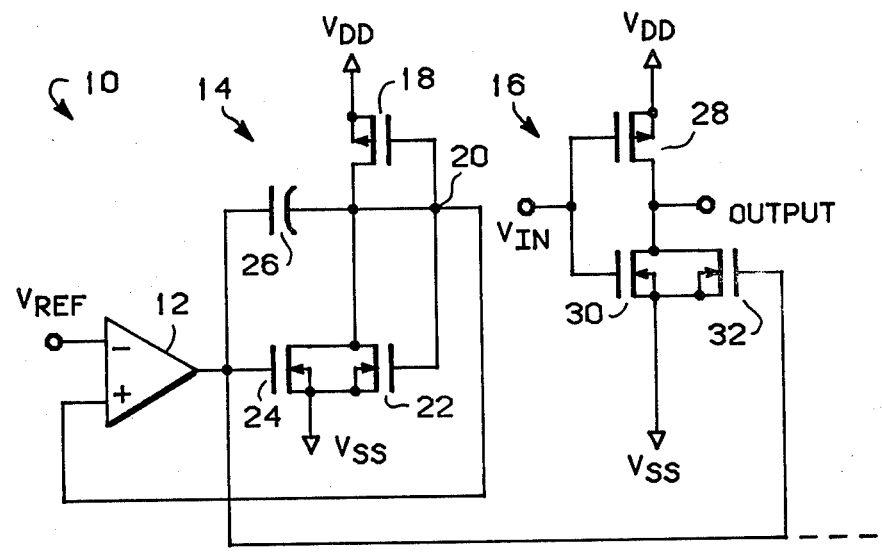
FIG. 1 is a schematic diagram illustrating an embodiment of the present invention.

FIG. 1 is a schematic diagram of a comparator 10, constructed in accordance with a first embodiment of the invention. Comparator 10 is comprised of an operational amplifier 12, a first inverter portion 14 and a second inverter portion 16. While specific N-channel and P-channel MOS devices are shown, it should be clear that comparator 10 could be implemented by completely reversing the processing techniques (E.G. P-channel to N-channel) or by using other types of transistors.

Referring to FIG. 1, first inverter portion 14 is comprised of a P-channel transistor 18 having both a control electrode or gate and a current electrode or drain coupled to a noninverting input of operational amplifier 12 at node 20 and a current electrode or source coupled to a first supply voltage $V_{DD}$. An N-channel transistor 22 has a current electrode or drain and the gate thereof coupled to node 20 and the source thereof coupled to a second supply voltage $V_{SS}$. A first control transistor 24 has the drain thereof coupled to both node 20 and the drain of transistor 22, the gate thereof coupled to an output of operational amplifier 12 and the source thereof coupled to supply voltage $V_{SS}$. Coupled to the inverting input of operational amplifier 12 is a predetermined reference voltage $V_{REF}$. A capacitor 26 is coupled between the output of operational amplifier 12 and node 20. Capacitor 26 is an optional element of comparator 10 and, when present, helps prevent unwanted circuit oscillation.

In the second inverter portion 16, a P-channel transistor 28 has the source thereof coupled to supply voltage $V_{DD}$, the gate thereof coupled to an input signal $V_{IN}$ and the drain thereof forms the output of comparator 10. An N-channel transistor 30 has the source thereof coupled to supply voltage $V_{SS}$, the gate thereof coupled to both the input $V_{IN}$ and the gate of transistor 28, and the drain thereof coupled to both the output and the drain of transistor 28. A second control transistor 32 has the gate thereof coupled to the output of operational amplifier 12, the source thereof coupled to supply voltage $V_{SS}$, and the drain thereof coupled to both the output and the drain of transistor 30.

In operation, $V_{REF}$ is a stable reference voltage. Transistors 18 and 22 form a conventional inverter but are connected to operate in a linear manner by having the output and input of the inverter portion 14 coupled together at node 20. Transistors 22 and 24 are coupled to the output and input of operational amplifier 12 to form a closed loop network. Because operational amplifier 12 has a slow slew rate, comparators 10 and 10' can be designed with transistors operating at low quiescent currents thereby allowing all transistors utilized to be small. Since a closed loop exists, operational amplifier 12 forces the voltage at both the noninverting input and node 20 to equal $V_{REF}$ minus any offset voltage associated with operational amplifier 12. The output voltage of operational amplifier 12 will vary with process and temperature but will be the voltage necessary to bias control transistor 24 so that the voltage at node 20 is equal to $V_{REF}$. In other words, $V_{REF}$ is setting the switch point of the inverter comprised of transistors 18 and 22. Therefore the second inverter portion 16 will also have a switch point at $V_{REF}$ if transistors 18 and 28, 22 and 30, and 24 and 32 have respectively proportional gate dimensions.

For purposes of illustration only, assume that $V_{REF}$ is three volts. When the input voltage $V_{IN}$ is zero volts, for example, transistor 28 is biased on and transistor 30 is biased off to produce a "high" level output. However transistor 32 is biased on slightly so that there is some leakage current which flows to the $V_{SS}$ supply. In a transient state when $V_{IN}$ is between two and four volts, both transistors 28 and 30 are slightly biased on to produce a momentary indeterminate state. Since for many applications $V_{IN}$ rapidly varies from zero to five volts, an indeterminate output is extremely brief and the output switches quickly. When $V_{IN}$ is approximately five volts transistor 28 is biased off completely and transistor 30 is biased on, thereby producing a "low" level output. However, transistor 32 remains biased slightly on at all times so that some current is constantly flowing through it. Additional inverter stages similar to second inverter portion 16 may be coupled to the output of operational amplifier 12 to allow comparison of multiple voltages.

Figure 2:
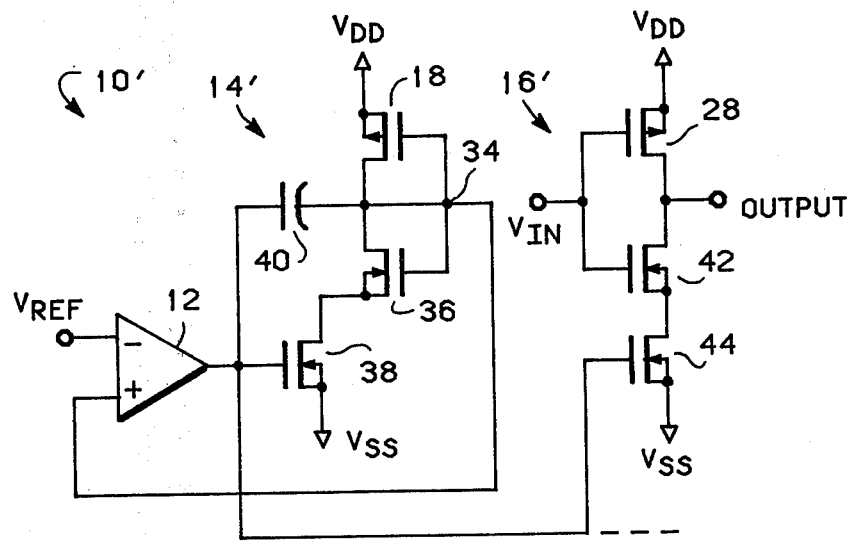
FIG. 2 is a schematic diagram illustrating another embodiment of the invention.

In general, the fact that control transistors 24 and 32 are constantly biased and sinking current from supply voltage $V_{DD}$ is disadvantageous because of power consideration. FIG. 2. illustrates, in schematic form, a modified form of comparator 10' which can be substituted for comparator 10 of FIG. 1 to substantially eliminate unwanted current flow. Comparator 10' is comprised of first inverter portion 14', second inverter portion 16' and operational amplifier 12. In this configuration, first inverter portion 14' is comprised of a P-channel transistor 18 having both the gate and drain thereof coupled to a noninverting input of operational amplifier 12 at node 34 and a source thereof coupled to $V_{DD}$. An N-chanel transistor 36 has the drain and gate thereof coupled to both node 34 and the noninverting input of operational amplifier 12. An N-chanel control transistor 38 has the drain thereof coupled to the source of transistor 36, the gate thereof coupled to the output of operational amplifier 12 and the source thereof coupled to $V_{SS}$. A capacitor 40 has one terminal thereof coupled to the output of operational amplifier 12 and the other terminal coupled to node 34.

In this configuration, the second inverter portion 16' comprises a P-channel transistor 28 which has the source thereof coupled to $V_{DD}$, the gate thereof coupled to $V_{IN}$ and the drain thereof forms the output of comparator 10'. An N-channel transistor 42 has the drain thereof coupled to both the drain of transistor 28 and an output, and the gate thereof coupled to both $V_{IN}$ and the gate of transistor 28. An N-channel control transistor 44 has the drain thereof coupled to the source of transistor 42, the source thereof coupled to $V_{SS}$ and the gate thereof coupled to the output of operational amplifier 12. In a preferred form, all transistors except transistors 36 and 42 have the substrates thereof connected to either $V_{DD}$ or $V_{SS}$ to eliminate the conventional body effect which would otherwise exist in the substrate to weaken the current drain of all transistors and reduce comparator speed. For similar reasons transistors 36 and 42 have their respective substrates and sources connected.

In operation, comparator 10' again uses the closed loop configuration of operational amplifier 12 to force the potential at node 34 to $V_{REF}$, and operational amplifier 12 furnishes the needed biasing voltage to control transistors 38 and 44. However, whenever $V_{IN}$ is zero volts or low enough to bias transistor 42 off, a "high" level output is produced and no current is allowed to flow between the output and $V_{SS}$ in this configuration. Current flows through transistors 42 and 44 only when $V_{IN}$ is in a transient change from five to zero volts or zero to five volts and when $V_{IN}$ is five volts. Transistor 28 is turned off completely when $V_{IN}$ is five volts and a "low" level output is produced. Capacitor 40, like capacitor 26, is optional for circuit 10' to perform but provides added stability. Another possible configuration for capacitor 40 to be utilized to prevent oscillation is to couple one terminal of capacitor 40 to the output of operational amplifier 12 and the other terminal to the drain of control transistor 38. Since the comparator circuits 10 and 10' are comprised of only two inverter portions each, the rise time is extremely fast. Variations in process and temperature which are seen at the output of operational amplifier 12 are not reflected at the output of either comparator 10 or 10' so that the switch point remains as stable as the reference voltage. The use of operational amplifier 12 in this configuration permits the reference voltage to vary from within one transistor threshold voltage of either $V_{SS}$ or $V_{DD}$. Since comparator 10' utilizes transistors 42 and 44 in series, the total gate to source capacitance of inverter portion 16' is less than the capacitance associated with transistors 30 and 32 of inverter portion 16. Further advantages of comparators 10 and 10' include the fact that all transistors of inverter portions 16 and 16' may be made large to allow comparators 10 and 10' to quickly charge and discharge any capacitive load at the output thereby increasing circuit speed. Thus a comparator having a fast rise time and an output pulse of constant width has been provided.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A high speed CMOS comparator circuit for comparing an input signal with a reference voltage, comprising:
   first inverter means;
   second inverter means;
   operational amplifier means having a first input coupled to a reference voltage, a second input coupled to said first inverter means, and an output coupled to said second inverter means; and
   control means coupled to said first and second inverter means and said operational amplifier means, for establishing a switch point of said first and second inverter means at said reference voltage.

2. The comparator circuit of claim 1 wherein the coupling of the first inverter means to the operational amplifier means forms a closed loop comprising said first inverter means and said operational amplifier means.

3. The comparator circuit of claim 2 wherein the first inverter means is connected to operate in a linear manner.

4. The comparator circuit of claim 2 or 3 wherein the first and second inverters comprise transistors having proportional gate dimensions, thereby having identical switch point voltages which are substantially independent of semiconductor process variations.

5. A high speed CMOS comparator circuit for comparing an input voltage with a reference voltage, comprising:
   operational amplifier means having a first input coupled to said reference voltage, a second input, and an output;
   a first transistor of a first conductivity type having a first current electrode coupled to a first supply voltage, and both a second current electrode and a control electrode coupled to the second input of said operational amplifier means;
   a second transistor of a second conductivity type having a first current electrode coupled to a second supply voltage, and both a second current electrode and a control electrode coupled to the second input of said operational amplifier means;
   a first control transistor of said second conductivity type having a control electrode coupled to the output of said operational amplifier means, a first current electrode coupled to said second supply voltage, and a second current electrode coupled to the second input of said operational amplifier means, for establishing a voltage potential at the noninverting input of said operational amplifier means which is approximately equal to said reference voltage;
   a third transistor of said first conductivity type having a first current electrode coupled to said first supply voltage, a control electrode coupled to an input voltage, and a second current electrode coupled to a circuit output;
   a fourth transistor of said second conductivity type having a control electrode coupled to said input voltage, a first current electrode coupled to said second supply voltage, and a second current electrode coupled to said circuit output; and
   a second control transistor of said second conductivity type having a first current electrode coupled to said circuit output, a second current electrode coupled to said second supply voltage, and a control electrode coupled to both the output of said operational amplifier means and the control electrode of said first control transistor, for providing an output voltage of a first level in response to said input voltage being less than said reference voltage and for providing an output voltage of a second level in response to said input voltage being greater than said reference voltage.

6. The comparator circuit of claim 5 wherein the dimensions of the gate sizes of said first and third transistors, said second and fourth transistors, and said first and second control transistors are respectively proportional, thereby producing substantially identical voltages across the transistors of the same gate dimensions.

7. A comparator circuit for comparing an input voltage with a reference voltage, comprising:
   operational amplifier means having a first input coupled to said reference voltage, a second input, and an output;
   a first transistor of a first conductivity type having a first current electrode coupled to a first supply voltage, and both a second current electrode and a control electrode coupled to the second input of said operational amplifier means;
   a second transistor of a second conductivity type having both a first current electrode and a control electrode coupled to the second input of said operational amplifier means, and a second current electrode;
   a first control transistor of said second conductivity type having a control electrode coupled to the output of said operational amplifier means, a first current electrode coupled to a second supply voltage and a second current electrode coupled to the second current electrode of said second transistor, for providing a substantially equal amount of current through said first and second transistors and establishing a voltage potential at the second input of said operational amplifier means which is approximately equal to said reference voltage;
   a third transistor of said first conductivity type having a first current electrode coupled to said first supply voltage, a control electrode coupled to an input voltage, and a second current electrode coupled to a circuit output;

a fourth transistor of said second conductivity type having a control electrode coupled to said input voltage, a first current electrode coupled to said circuit output, and a second current electrode; and
a second control transistor of said second conductivity type having a first current electrode coupled to said second supply voltage, a second current electrode coupled to the second current electrode of said fourth transistor, and a control electrode coupled to both the output of said operational amplifier means and the control electrode of said first control transistor, for providing an output voltage of a first level in response to said input voltage being less than said reference voltage and for providing an output voltage of a second level in response to said input voltage being greater than said reference voltage.

* * * * *